United States Patent [19]

Moret

[11] Patent Number: 5,439,552
[45] Date of Patent: Aug. 8, 1995

[54] PROCESS OF FABRICATING AN ENLONGATED MICROSTRUCTURE ELEMENT ON A SUBSTRATE

[75] Inventor: Jean-Marc Moret, Cortaillod, Switzerland

[73] Assignee: CSEM - Centre Suisse d'Electronique et de Microtechnique SA, Neuchatel, Switzerland

[21] Appl. No.: 145,697

[22] Filed: Nov. 4, 1993

[30] Foreign Application Priority Data

Nov. 4, 1992 [FR] France .................. 92 13352

[51] Int. Cl.⁶ .............................................. B44C 1/22
[52] U.S. Cl. ........................................ 216/2; 437/228
[58] Field of Search ............... 156/653, 652, 651, 650, 156/657, 656, 643; 437/228

[56] References Cited

U.S. PATENT DOCUMENTS

| | | | |
|---|---|---|---|
| 3,539,705 | 11/1970 | Nathanson et al. | 156/650 |
| 3,620,932 | 11/1971 | Crishal | 204/15 |
| 3,796,976 | 3/1974 | Heng et al. | 333/84 M |
| 4,624,741 | 11/1986 | Daniele | 156/645 |
| 4,674,180 | 6/1987 | Zavracky et al. | 156/652 |
| 4,744,863 | 5/1988 | Guckel et al. | 156/651 |
| 4,783,237 | 11/1988 | Aine et al. | 437/15 |
| 4,849,070 | 7/1989 | Bly et al. | 156/643 |
| 4,959,515 | 9/1990 | Zavracky et al. | |
| 4,997,521 | 3/1991 | Howe et al. | |
| 5,068,203 | 11/1991 | Logsdon et al. | 437/89 |
| 5,262,000 | 11/1993 | Welbourn et al. | 156/653 |
| 5,266,531 | 11/1993 | Kikinis | 437/228 |

FOREIGN PATENT DOCUMENTS 286337 10/1988 European Pat. Off. .

*Primary Examiner*—Olik Chaudhuri
*Assistant Examiner*—Long Pham
*Attorney, Agent, or Firm*—Sughrue, Mion, Zinn, Macpeak & Seas

[57] ABSTRACT

The invention concerns a fabrication process of at least one generally elongated structural element (14) on a substrate (12) in a first material and having a substantially flat upper face (13), said element (14) realized in a second material comprising at least a first wing (14a) parallel to a plan perpendicular to said upper face (13).

10 Claims, 3 Drawing Sheets

A-A'  B-B'  C-C'

PROCESS OF FABRICATING AN ENLONGATED MICROSTRUCTURE ELEMENT ON A SUBSTRATE

BACKGROUND OF THE INVENTION

The invention concerns generally processes for the fabrication of a micromechanical structural element from a substrate, notably using semiconductive material by micromachining techniques.

More particularly, the invention concerns a process for fabricating a generally elongated structural element having at least one wing, which is thin with respect to its other dimensions, and extends in a direction substantially perpendicular to the substrate.

Such structural elements are found notably in applications concerning mechanical microstructures and particularly in microstructures such as X/Y tables, activators or the like.

As in classical mechanics, micromechanics use structural elements having different forms and sections adapted to the mechanical properties desired in an intended application.

A particular problem always arises in micromechanics relating to the fabrication of generally elongated elements such as beams or likes structures.

FIGS. 1 to 4 illustrate the difference stages of a conventional process used to fabricate a generally elongated structural element, in this instance a beam having a rectangular section.

According to this process, a substrate 1, for example of a semiconducting material, has an oxyde layer 2, called a sacrificial layer, (FIG. 1) applied to its surface. A layer 4 of material is then deposited, this layer being intended to form the beam 6 and having a thickness E defining the height of the beam (FIG. 2). The shape and the dimensions of the plane of the beam 6 are thus defined in the layer 4 by a classic lithography process and the layer 4 is etched according to the shape and dimensions thus defined (FIG. 3). The part of the layer 2 in the region of and under the beam 6 is finally submitted to a selective and isotropic etching in order to liberate the beam 6 (FIG. 4) which rests anchored, at least at one of its extremities, to the substrate 1.

Many microstructures exist whose operation requires the formation of structural elements having at least one wing which is thin relatively thin compared to its other dimensions and notably when compared to its dimension (its height) which extends in a direction perpendicular to the substrate, and thus has a great flexibility in a direction parallel to the plan of the substrate whilst also having a great rigidity in a direction perpendicular to the plan.

In fact, when one wishes, for example, to fabricate a suspension structure for an X/Y table in polysilicon which can be activated electrostatically, such as that which is described in the publication entitled "Micro Electro Mechanical Systems '92" Travenmünde (Germany), on 4–7 Feb. 1992 by V. P. Jaecklin, C. Linder, N. F. de Rooij, J. M. Moret, R. Bischof and F. Rudolf, it is desirable, in order to improve its operating characteristics and notably the forces therewithin, to realize long, very straight beams in thick layers. In other words, if the table extends in an X/Y plane and the beams forming its suspension structure have their width, length and height respectively along the axes X, Y and Z (the axis Z being perpendicular to the X/Y plane), the relation of the height to the width, known generally by the term "aspect ratio", must be as large as possible and preferably in the order of 10/1 for a width in the order of 0.2 µm.

However, the aspect ratio that can be obtained by classical processes such as those described above is in the order of 2/1 for a minimum width of about 1 µm.

This aspect ratio is limited by the practical impossibility of realizing a completely anisotropic etching of the beam material (etching uniquely along the Z axis and no etching along the X and Y axes). The etching of great heights leads consequently to beams whose section is trapezoidal and whose mechanical properties vary along their height. Thus, this acts against the optimal operation of the table by increasing the restraints of flexion and therefore the tensions necessary to operate the table.

Furthermore, it can be easily understood that even if, in principle, the classical processes allow the formation of structural elements having non rectangular sections, such as sections in the form of a U, L or a combination of U and L at the price of an extremely complex fabrication, these processes do not allow, taking into account the above, the realization of structural elements having several wings of rectangular section connected together with each of the wings having a small thickness, for example 0.2 µm, whatever may be their orientation with respect to the plane of the substrate.

SUMMARY OF THE INVENTION

The aim of the invention is to ameliorate the inconveniences of the above mentioned prior art by providing a fabrication process of a structural element for micromechanics, notably a generally elongated structural element having at least one thin wing extended along a direction substantially perpendicular to the substrate, this structural element being able to have a wide range of cross sections.

With this in mind, the invention provides a process of fabricating a generally elongated structural element from a substrate in a first material and having a substantially flat upper face, said element, being made from a second material, comprising at least a first wing parallel to a plane perpendicular to said upper face, characterized in that it comprises the following successive steps:

forming a sacrificial layer on said upper face, structuring said sacrificial layer by selectively etching said sacrificial layer in a direction perpendicular to said upper face so as to define at least a first wall perpendicular to said upper face, depositing a layer of said second material on the surface of said structured sacrificial layer so that at least said first wall is covered by a part of said first layer, selectively etching said layer of said second material so as to leave at least said part of said layer of said second material which extends along said wall, and eliminating said sacrificial layer at least in the region of and under said part of the first layer of said second material so as to form said first wing.

According to this process, the width of the wings of the structural element is advantageously defined by the thickness of the first layer and not by the lithography as in the case of prior art processes.

Other characteristics and advantages of the invention will become clear from the following description of the fabrication process of the invention, given as a purely illustrative and non limitative example, this description being made in relating to the drawings in which:

DESCRIPTION OF PREFERRED EMBODIMENTS

The description of the fabrication process of a generally elongated structural element which follows will be made in the setting of an application of the process to the fabrication of a suspension microstructure of a table which is mobile in an X/Y plane of the type described in the above mentioned reference. Of course, such a process may be used in many other interesting applications, for example to form orientable mirrors, optical shutters and micromanipulators.

In addition, although the base material for forming said structural element according to the invention is a semiconductive material, it is to be noted that other types of material, such as notably aluminium, may be also used.

Figure 1:
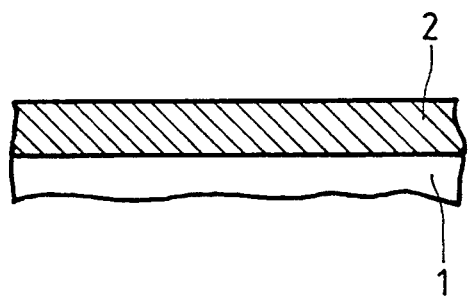
FIGS. 1 to 4, mentioned previously, are cross sectional views of a structural element whose form is generally elongated from a substrate, represented at different stages of a classic fabrication process.
Figure 2:
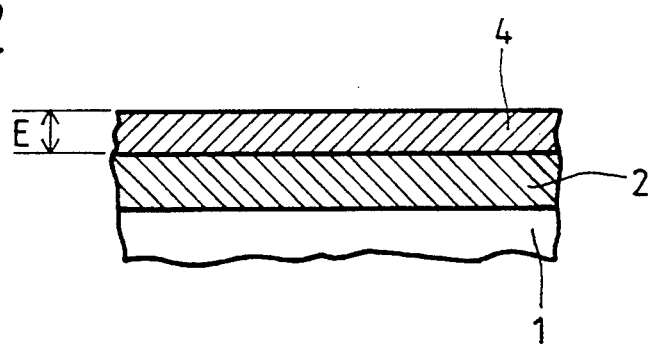
Figure 3:
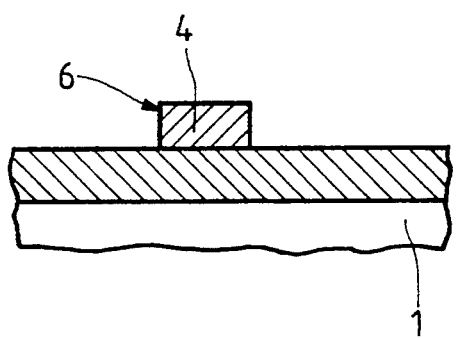
Figure 4:
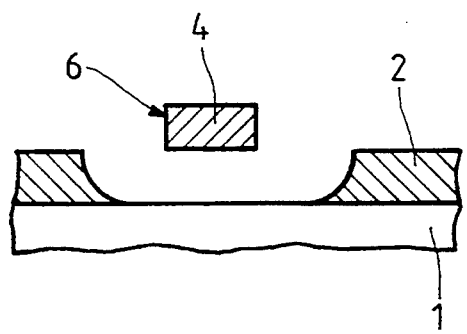
Figure 5:
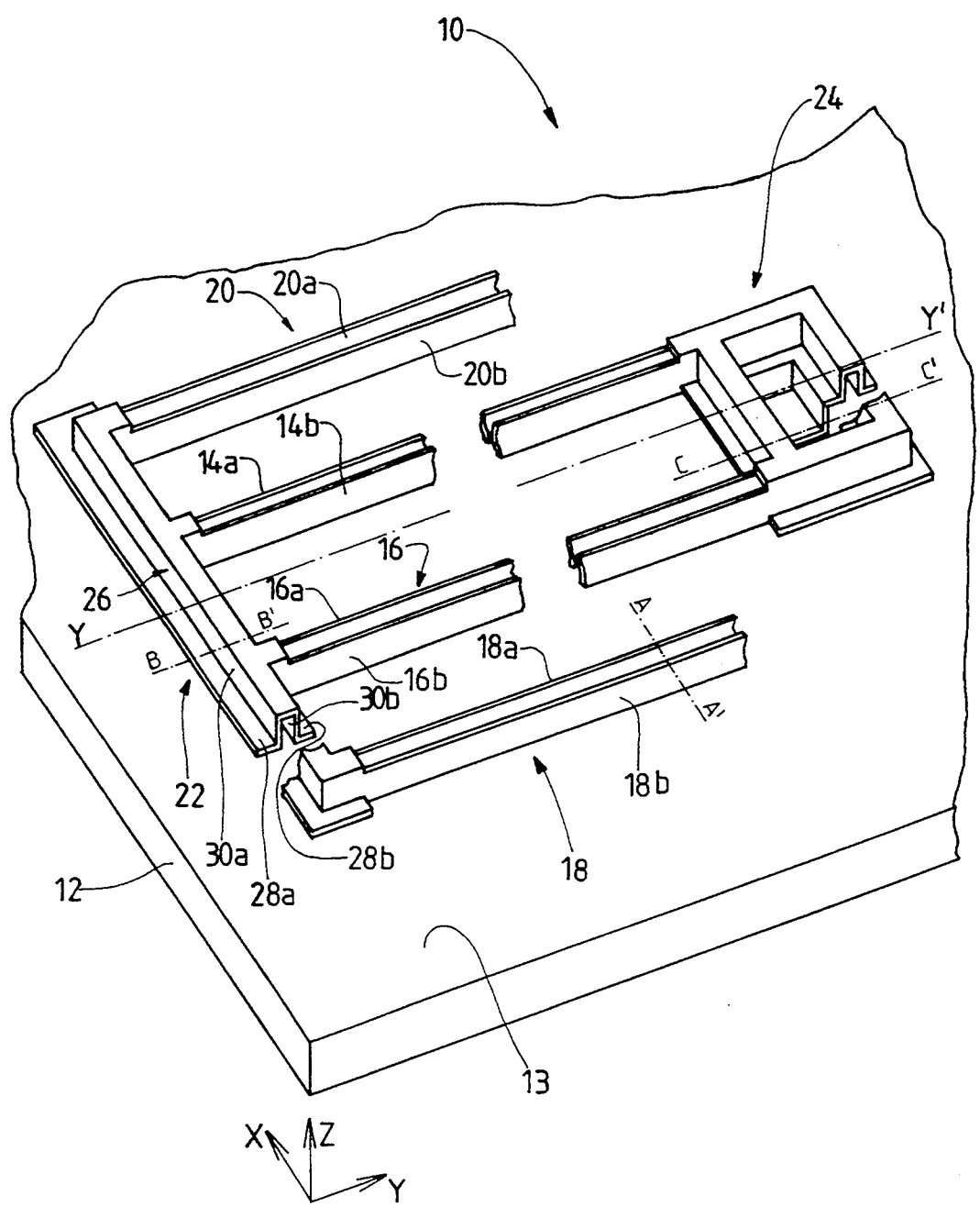
FIG. 5 is a partial perspective view of suspension means of a mobile X/Y table formed with the assistance of structural elements obtained according to the process of the invention.

Referring now to FIG. 5, a partial perspective view is seen of the suspension structure 10 of a mobile table (not illustrated) which extends parallel to a plan defined by the axes X/Y. This structure 10 comprises a plurality of structural elements having a generally elongated form formed on a substrate 12 which has a generally flat upper face 13 parallel to the plane defined by the axes X/Y.

The structure 10 comprises notably four flexion beams 14, 16, 18 and 20, liaison means 22 rigidly connecting the flexion beams 14, 16, 18 and 20 together and anchoring means 24 of the structure 10.

The flexion beams 14, 15, 18 and 20 are each formed of two wings 14a, 14b, 16a, 16b, 18a, 18b and 20a and 20b having parallel faces and having their width, their length and their height extending respectively along the axis X/Y and Z (the axis Z being perpendicular to the plan X/Y). Each wing has a rectangular section and the relation of its height to its width is greater than 5 for a width of approximately 0.2 μm.

All of the flexion beams 14, 16, 18 and 20 are connected by a first extremity to the liaison means 22. Further, the two central flexion beams 14 and 16 are connected by their second extremity to the anchoring means 24 whilst the exterior beams 14 and 16 are connected by their second extremity to the mobile table (not represented). The structure 10 is thus suspended above the upper face 13 of the substrate 12.

The liaison means 22 are formed from a beam 26 which has the profile of an inverted U having two lateral wings 28a and 28b each connected to the extremity of the branches 30a and 30b of the U and extending perpendicularly thereto.

As to the anchoring means 24, these have the form of an open case formed from beams whose profile will be described in connection with the process and FIG. 14.

The successive steps of the fabrication process will now be described, according to the invention, of the different generally elongated structural elements, or beams, of the suspension structure 10 described above with reference to FIGS. 6 to 14.

It would be firstly noted that taking into account the small dimensions of the suspension structure, and for practical reasons that will be easily understood, the fabrication process applies to the simultaneous fabrication of a large number of suspension structures on the same plate defining the substrate 12.

Further, it is important to note that the values of the different parameters such as the temperature, the time and the reactants used etc. described in the process are in no way limitative, depending essentially on the materials used and the apparatus used. These values may by consequence easily by determined by a man skilled in the art.

The plates (not illustrated) defining the substrate 12 on which the suspension structure is constructed are formed in a first material having the following characteristics. The plates may be of monocrystaline silicon having any desirable orientation and resistivity. In this regard, the orientation and the resistivity of the silicon of the substrate may be, the case arising, determined as a function of the characteristics of an integrated circuit formed in the surface of this substrate.

Referring more particularly now to FIGS. 6 to 10, the substrate 12 is seen in different successive steps of its preparation regarding the depositing of the layer of a second material (described below) which will form the generally elongated structural elements.

Figure 6:
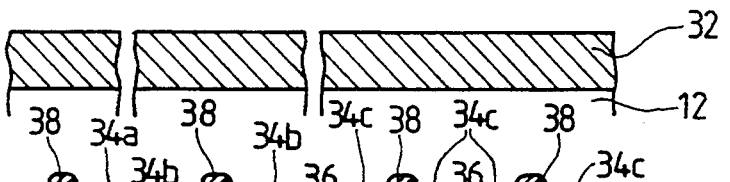
FIGS. 6 to 14 are cross sectional views along the lines A-A', B-B', and C-C' of the FIG. 5 of respectively a first, a second and a third part of the suspension means, represented at different stages of its fabrication process according to the invention.

The substrate 12 is represented in FIG. 6, this substrate being previously polished on at least its upper face 13 and on which has been deposited a sacrificial layer 32 of silicon dioxide ($SiO_2$). Preferably, the $SiO_2$ is doped with 5% of phosphor. In fact, this doping increases the etching speed of the $SiO_2$ which is advantageous for the following steps of structuration and/or elimination of the sacrificial layer.

In the example described, the layer 32 has been deposited by a chemical phase deposition process (CVD) to a thickness of about 2 μm and at a temperature of approximately 425° C. As would be understood from the following description, the thickness of this layer determines the maximum height of the structural element which may be fabricated, and this thickness may be easily varied between 0.5 μm and 3 μm.

It is to be noted that, according to a variation, the deposition of this layer 32 of $SiO_2$ may be formed by oxidation of the substrate in an oven at an appropriate temperature, during a certain time and under an appropriate atmospheric pressure, the oxidation being followed by a step in which phosphor is deposited by chemical phase deposition (CVD) and a step during which phosphor is diffused in the layer 32.

Figure 7:
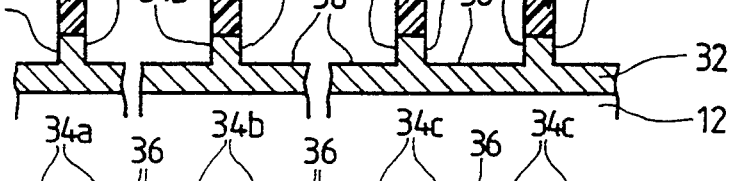
Figure 8:
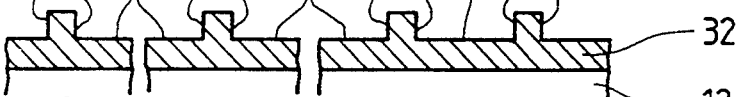

At the following step illustrated in FIGS. 7 and 8, one proceeds with the structuration of the layer 32 on the first level, that is to say, first part of its thickness. In other words, one defines simultaneously a first series of walls 34a, 34b, 34c perpendicular to the X/Y plane, and intermediate surfaces connecting the walls 34a, 34b, 34c two by two, which will act respectively, in the following, to form the wings 14a, 14b, 16a, 16b, 18a, 18b, 20a and 20b of the flexion beams, the liaison means 22 and a part of anchoring means 24 (FIG. 5).

To do this, a first layer of photosensitive resin 38 is deposited, for example by a turntable, on the layer 32, the layer 38 is exposed through a mask (not illustrated), the exposed parts of the layer 38 are developed classically by a humid etching, the uncovered parts of the layer 32 are directly etched, in an anisotropic manner, up to the first layer, in this case at about 1 μm, in order to form the walls 32, and then the resistant parts of the layer 38 are eliminated.

The directional etching operation is achieved, for example, by means of an anisotropic plasma $CHF_3/C_2F_6/He$ and the elimination of the resistant parts of the layer 38 is achieved in a classic manner, for example, by means of an isotropic plasma $O_2$.

Figure 9:
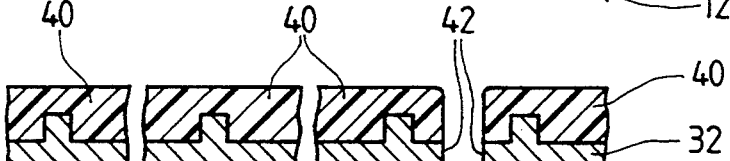
Figure 10:
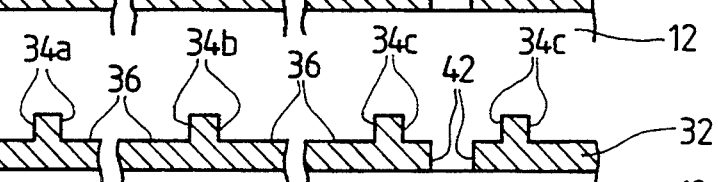

The FIGS. 9 and 10 illustrate the steps of the structuration of the layer 32 on a second level, these steps being identical to those described in connection with FIGS. 7 and 8. Nevertheless, it should be noted that this structuration consists of etching the layer 32 on another part of its thickness to non protected locations by a second layer of photosensitive resin 40 previously exposed through a second mask so as to form a second series of walls 42 extending parallel to the first series of walls 32. In the example described, this structuration comprises notably the formation of a second series of walls 42 from the first level until the second level of the thickness of the layer 32 which is located at the level of the upper face 13 of the substrate 12.

Figure 11:
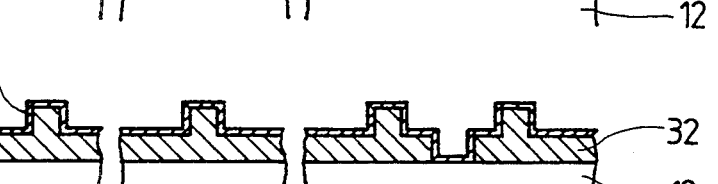

The following step illustrated in FIG. 11 consists of depositing a layer 44 of a second material on the structured layer 32. It would be noted that in this application, the layer 42 is made of polycristaline silicon.

In order to do this, one deposits a layer of 0.2 μm of polycristaline silicon by low pressure chemical vapour position (LPCVD) at 625° C. in the presence of $SiH_4$ $O_2$ on the layer 32.

It will be noted that the thickness of this layer 44 will define respectively the width of the wings of the beams which extend parallel to this upper face 13.

Figure 12:
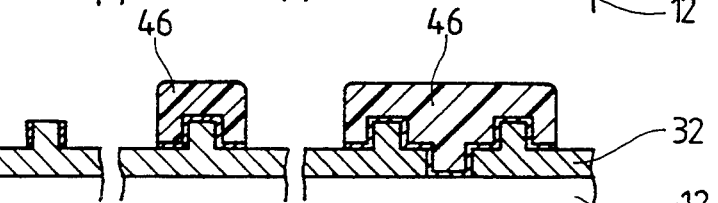
Figure 13:
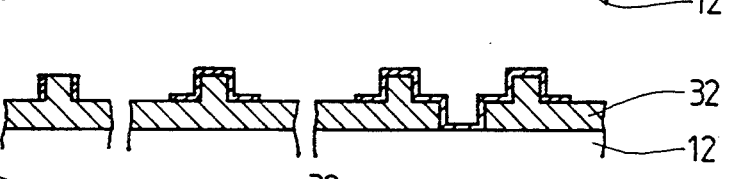

At the following step illustrated in FIGS. 12 and 13, one proceeds with the directional an selective etching of the layer 44 so as to define the geometry of the structural elements that one wishes to obtain, that is to say in the present case, the geometry of the flexion beams 14, 16, 18 and 20, the geometry of the beam 26 forming the liaison means 22 and the beams of the case forming the anchoring means 24.

To this effect, a third layer of photoresistive resin 46 is deposited on the entire surface of the layer 44, one exposes the layer 46 through a third mask (not represented), the exposed parts of the layers 46 are developed classically by humid etching, the path of the layer 44 discovered on the entire thickness of this layer 44 is directionally, in this circumstance at about 0.2 μm, and finally one eliminates the resistant parts of the layer 46.

The directional etching operation is carried out, for example, by means of an anisotropic plasma $CHF_3/C_2F_6/He$ and the elimination of the resistant parts of the layer 46 is achieved in a classical manner, for example, by means of an anisotropic plasma $O_2$.

Figure 14:
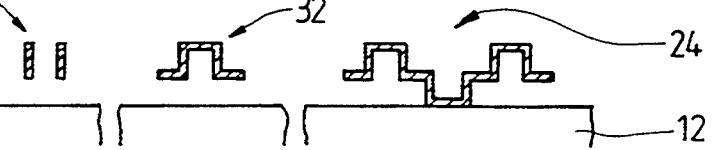

At the following step, illustrated in FIG. 14, all the structural elements defined in the preceding steps are liberated by eliminating the sacrificial layer 32 at least in the region of and beneath the structural elements. The elimination of the layer 32 is for example achieved by isotropic chemical etching with the assistance of a solution of fluoridic acid (HF) at 5% and at ambient temperature.

I claim:

1. A process of fabricating a generally elongated structural element (14) on a substrate (12) which is made of a first material and which has a substantially flat upper surface (13), said element (14), made of a second material, comprising at least a first wing (14a) parallel to a plane perpendicular to said upper face (13), said process comprising the following successive steps:
   forming a sacrificial layer (32) on said upper face (13),
   structuring said sacrificial layer (32) by selectively etching said sacrificial layer in a direction perpendicular to said upper face so as to define at least a first wall (34a) perpendicular to said upper face (13),
   depositing a first layer (44) of said second material on the surface of said structured sacrificial layer (32) so that at least said first wall is covered by a part of said first layer,
   selectively etching said layer (44) of said second material so as to leave at least said part of said layer (44) of said second material which extends along said wall (34a), and
   eliminating said sacrificial layer (32) at least in the region of and under said part of the first layer of said second material so as to form said first wing (14a).

2. The process according to claim 1, characterized in that the step of the structuring of said sacrificial layer (32) comprises the following successive steps:
   depositing a first layer (38) of photosensitive resin on the surface of said sacrificial layer (32),
   etching said first layer (38) of photosensitive resin through a first mask,
   developing the photosensitive isolated part of said first layer (38) so as to uncover a part of said sacrificial layer (32),
   directionally etching said uncovered part of said sacrificial layer (32) on at least a part of its thickness until a first level so as to form said first wall (34), and
   eliminating the resistant parts of said first layer (38) of photosensitive resin.

3. The process according to claim 2, characterized in that the step of selectively and directionally etching said first layer (44) of said second material comprises, after the step consisting of eliminating the resistant parts of said first layer (38) of photosensitive resin, the following successive steps:
   depositing a second layer (40) of photosensitive resin on the surface of said first layer (44) of said second material,
   exposing said second layer (40) of photosensitive resin through a second mask, and
   developing and eliminating the isolated pans of said second photosensitive layer (40), and
   in that the step of eliminating said sacrificial layer (32) is achieved by isotropic etching.

4. The process according to claim 3, characterized in that said first and second materials are semiconducting materials and in that said sacrificial layer (23) is an oxide of a semiconducting material.

5. The process according to claim 4, characterized in that said step of structuring said sacrificial layer (32) and said step of directionally and selectively etching said first layer (44) of said second material are achieved with the aid of a plasma.

6. The process according to claim 5, characterized in that the step of eliminating said sacrificial layer (32) is achieved by humid etching.

7. Process according to claim 3 characterized in that the step of structuring said sacrificial layer (32) further includes a step consisting of defining a second wall (34b) which extends parallel to the first wall (34a) so as to define a second wing (16a).

8. Process according to claim 7, characterized in that the step of structuring said sacrificial layer (32) further comprises the formation of said second wall (34b) from said first level until a second level of the thickness of said sacrificial layer (32).

9. Process according to claim 7, characterized in that the step of structuring said sacrificial layer (32) further comprises the formation of said second wall (34b) from said first level of the thickness of said sacrificial layer (32).

10. Process according to claim 7 or 8, characterized in that the step of structuring said sacrificial layer (32) further comprises the formation of an intermediate surface (36) connecting the first (34a) and the second (34b) wall.

* * * * *